(12) United States Patent
Sakaue et al.

(10) Patent No.: US 7,225,732 B2
(45) Date of Patent: Jun. 5, 2007

(54) SCREEN PRINTER

(75) Inventors: Takaaki Sakaue, Fukuoka (JP); Seikou Abe, Fukuoka (JP); Yuji Otake, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 197 days.

(21) Appl. No.: 11/038,867

(22) Filed: Jan. 19, 2005

(65) Prior Publication Data

US 2005/0155501 A1    Jul. 21, 2005

(30) Foreign Application Priority Data

Jan. 21, 2004  (JP) .................. P 2004-012652

(51) Int. Cl.
*B05C 17/08* (2006.01)
(52) U.S. Cl. ............... 101/127.1; 101/101; 101/126
(58) Field of Classification Search .......... 101/127.1, 101/127, 128.1, 126, 128, 123
See application file for complete search history.

(56) References Cited

U.S. PATENT DOCUMENTS

| 5,157,438 | A |   | 10/1992 | Beale .................... 355/72 |
| 5,582,104 | A | * | 12/1996 | Best et al. ............... 101/126 |
| 5,941,171 | A | * | 8/1999 | Fromm ................... 101/127.1 |
| 5,943,953 | A | * | 8/1999 | Oleson .................. 101/114 |
| 6,101,938 | A | * | 8/2000 | Adams .................. 101/126 |
| 6,264,187 | B1 | * | 7/2001 | Hertz et al. ............. 269/266 |
| 6,422,139 | B1 | * | 7/2002 | DeCruz ................. 101/127.1 |
| 6,715,413 | B2 | * | 4/2004 | Yamasaki et al. ......... 101/123 |
| 2001/0004795 | A1 |   | 6/2001 | Ishitani et al. ........... 22/559 |
| 2002/0154491 | A1 |   | 10/2002 | Suhara .................. 361/752 |

FOREIGN PATENT DOCUMENTS

| EP | 0 606 928 A1 | 7/1994 |
| JP | 2001-38876 | 2/2001 |

OTHER PUBLICATIONS

Patent Abstracts of Japan, vol. 016, No. 270, Jun. 1992, JP 04 065243, English Abstract.
Patent Abstracts of Japan, vol. 1996, No. 05, May 1996, JP 08 001908, English Abstract.
Patent Abstracts of Japan, vol. 1998, No. 13, Nov. 1998, JP 10 217424, English Abstract.
Patent Abstracts of Japan, vol. 2003, No. 07, Jul. 2003, JP 2003-062971, English Abstract.

* cited by examiner

*Primary Examiner*—Anthony H. Nguyen
(74) *Attorney, Agent, or Firm*—Pearne & Gordon LLP

(57) ABSTRACT

In a screen printer for printing paste to the substrate through a pattern hole by abutting a mask plate on the substrate, the end face of a side end portion of the substrate is nipped and held from its both sides by a clamper. A warp correcting portion mounting a warp-correcting member constructed by a plate-shaped resilient metal is arranged in the clamper. When the substrate held to a substrate holding portion of a Z-axis table is clamped, a free end portion of the warp correcting member is abutted on the upper face side of the side end portion of the substrate, and the warp deformation of the substrate is corrected by pressing the free end portion downward. Thus, the warp deformation of the substrate is corrected by a simple and cheap mechanism, and the clamp state can be reliably held.

7 Claims, 6 Drawing Sheets

SCREEN PRINTER

BACKGROUND OF THE INVENTION

The present invention relates to a screen printer for printing paste such as cream solder, electrically conductive paste, etc. to a substrate.

In a mounting process of an electronic part, screen printing is used as a method for printing paste such as cream solder, electrically conductive paste, etc. onto the substrate. In this method, a mask plate having a pattern hole arranged in accordance with a printing object part is abutted on the substrate and a squeegee is slid by supplying the paste onto the mask plate so that the paste is printed onto the substrate through the pattern hole.

In the screen printing, it is necessary to closely attach the substrate to the mask plate, and correctly hold the position of the substrate so as not to cause a horizontal position shift. Therefore, a lower receiving portion abutted on the lower face of the substrate and supporting the substrate, and a clamp mechanism for nipping a side end portion of the substrate from both sides thereof and holding the position of the substrate are arranged in a substrate holding portion for holding the substrate.

There are many cases in which the carried-in substrate is generally flexed, warped and deformed in the thickness direction. Therefore, a screen printer in which a mechanism for correcting the flexure by pressing the substrate held to the substrate holding portion from the upper side is arranged in a place except for a printing position is known for the purpose of correcting the warp of the substrate in the clamping in the substrate holding portion (e.g., see Japanese Patent Publication 2001-38876).

However, in the above conventional screen printer, an equipment occupying area and equipment cost are increased by separately arranging the mechanism for correcting the flexure, and disadvantages of clamp dislocation explained below are easily caused. Namely, in the above screen printer, it is necessary to move the substrate holding position until the printing position after the substrate is clamped. However, in the case of the substrate of a kind tending to be strongly warped, the disadvantage that the substrate is dislocated from the clamp state during this movement is caused. Thus, in the conventional screen printer, a problem exists in that it is difficult to reliably hold the clamp state by correcting the warp deformation of the substrate by a simple and cheap mechanism.

SUMMARY OF THE INVENTION

Therefore, an object of the present invention is to provide a screen printer able to reliably hold the clamp state by correcting the warp deformation of the substrate by the simple and cheap mechanism.

The present invention resides in a screen printer in which a mask plate having a pattern hole is abutted on a substrate positioned in a substrate positioning portion, and paste is printed in the substrate through said pattern hole by supplying the paste onto the mask plate and sliding a squeegee; wherein the screen printer comprises a substrate holding portion for holding the substrate in said substrate positioning portion; clamp means for nipping and holding the end face of a side end portion of the substrate held to said substrate holding portion from its both sides by the clamp face of a clamp member; a warp correcting portion arranged in said clamp member and correcting warp deformation of the substrate by abutting a warp correcting member on the upper face side of the side end portion of the substrate and pressing the warp correcting member in a state in which said substrate is nipped by the clamp member; and position aligning raising-lowering means for aligning the height position of the upper face of the held substrate with the lower face of said warp correcting member by raising and lowering said substrate holding portion.

In accordance with the present invention, the warp correcting portion is arranged in the clamp member and corrects warp deformation of the substrate by abutting the warp correcting member on the upper face side of the side end portion of the substrate in the state in which the substrate is nipped by the clamp member. The height position of the upper face of the held substrate is aligned with the lower face of the warp correcting member by raising and lowering the substrate holding portion. Since this construction is adopted, the warp deformation of the substrate is corrected by a simple and cheap mechanism, and the clamp state can be reliably held.

DETAILED DESCRIPTION OF THE PREFERRED EMBODIMENTS

Figure 1:
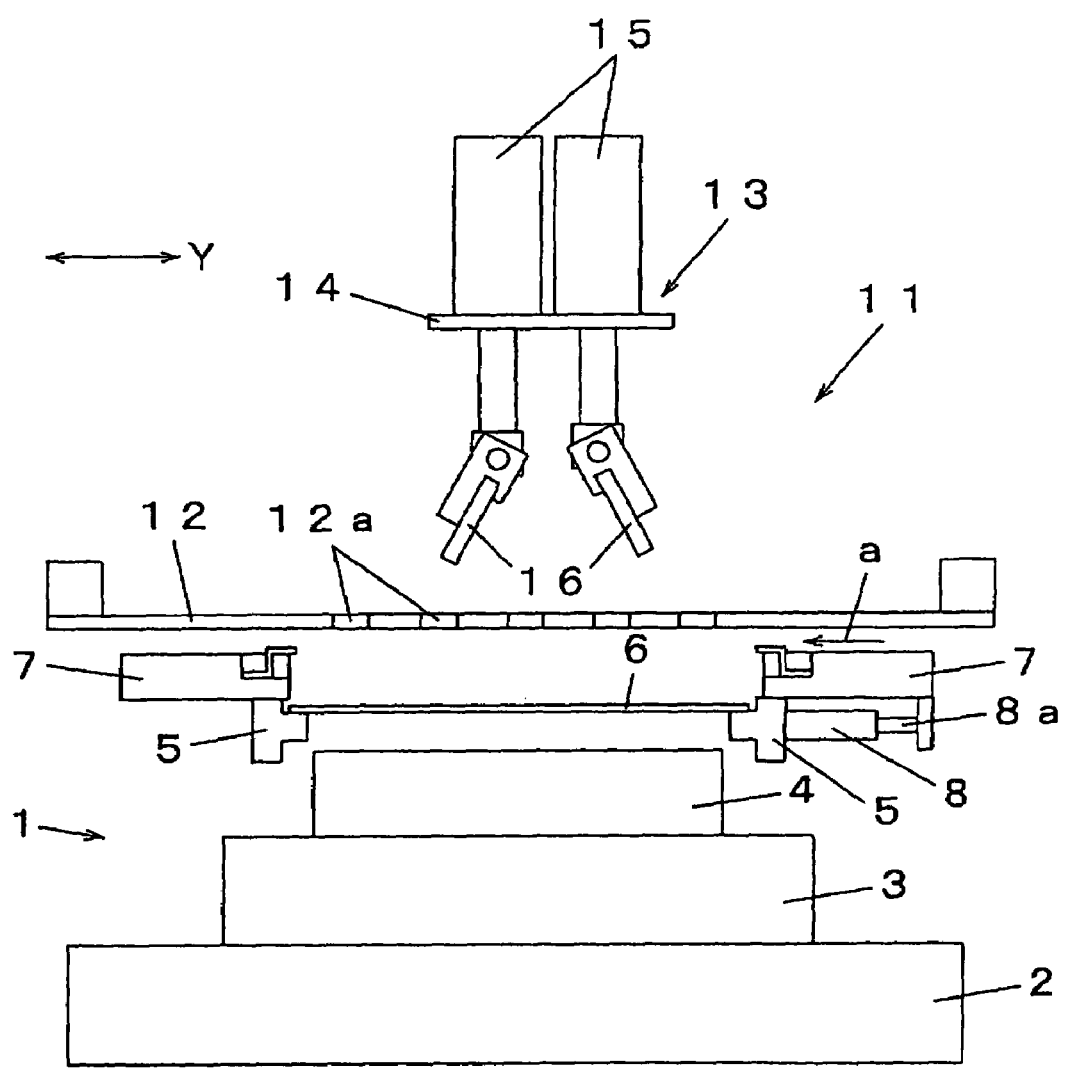
FIG. 1 is a side view of a screen printer in one embodiment mode of the present invention.

The embodiment modes of the present invention will next be explained with reference to the drawings. First, with reference to FIGS. 1 and 2, the structure of the screen printer will be explained. In FIG. 1, a substrate positioning portion 1 is constructed by stepwise stacking a Z-axis table 4 on a moving table constructed by a Y-axis table 2 and an X-axis table 3. A substrate holding face for adsorbing and holding a substrate 6 is arranged on the upper face of the Z-axis table 4. Accordingly, the Z-axis table 4 constitutes a substrate holding portion for receiving the substrate 6 from the lower side and holding the substrate 6 in the substrate positioning portion 1. The position of the substrate 6 at the screen printing time can be adjusted by moving the substrate 6 held in the substrate holding portion in the X-direction and the Y-direction by controlling the operations of the Y-axis table 2 and the X-axis table 3. Further, the height of the held substrate 6 can be set to an arbitrary height by controlling the operation of the Z-axis table 4.

A pair of conveying rails 5 are horizontally arranged above the substrate positioning portion 1. The conveying rail 5 conveys the substrate 6 received from a carrying-in rail 9 (FIG. 2) of the upper side in the X-direction until the substrate positioning portion 1. After the printing is performed by a screen printing portion 11 described later in the substrate positioning portion 1, the substrate 6 is carried out to the downstream side by a carrying-out rail 10. The conveying rail 5 constitutes a substrate conveying means for conveying the substrate until the substrate positioning portion 1.

Each of the conveying rails 5 constituting the pair has a clamper 7 (clamp member). The clamper 7 on one side is connected to a moving rod 8a of a clamp driving mechanism 8 and can be moved in the horizontal direction. In a projecting state of the moving rod 8a, the clamper 7 is located in a position separated from a side end portion of the substrate 6, and is in a clamp release state. The clamper 7 on the movable side is moved in the direction of an arrow a by performing a returning operation of the moving rod 8a, and nips and clamps the end face of the side end portion of the substrate 6 held to the substrate holding portion by two clamp faces 7a. Namely, the clamper 7 and the clamp driving mechanism 8 constitute a clamp means for nipping and holding the end face of the side end portion of the substrate 6 held to the substrate holding portion from both sides thereof by a clamp face of the clamp member.

The screen printing portion 11 is arranged above the substrate positioning portion 1. The screen printing portion 11 is constructed by arranging a squeegee unit 13 on a mask plate 12 having many pattern holes 12a. The substrate 6 is aligned in position with the mask plate 12 by the substrate positioning portion 1, and is abutted on the mask plate 12 from its lower direction. The squeegee unit 13 is constructed by arranging a squeegee 16 so as to be freely raised and lowered by two squeegee raising-lowering mechanisms 15 arranged perpendicularly to a horizontal base 14, and is reciprocated in the Y-direction by an unillustrated squeegee moving mechanism.

In a state in which the substrate 6 is abutted on the lower face of the mask plate 12, cream solder as paste is supplied onto the mask plate 12 and is printed on the surface of the substrate 6 through the pattern hole 12a by abutting the squeegee 16 on the surface of the mask plate 12 and sliding this squeegee 16. In this screen printing operation, the substrate 6 is clamped from its both sides by the clamper 7 and its horizontal position is held.

Figure 2:
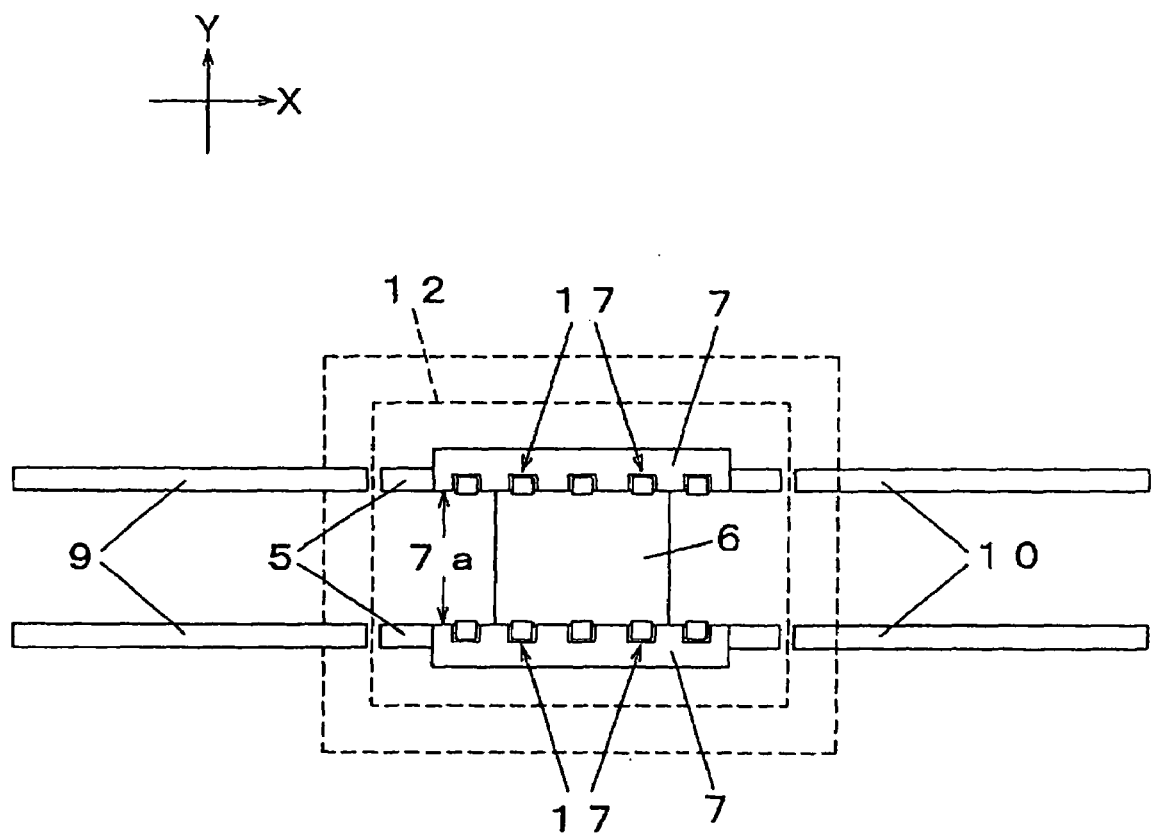
FIG. 2 is a plan view of the screen printer in one embodiment mode of the present invention.
Figure 3A:
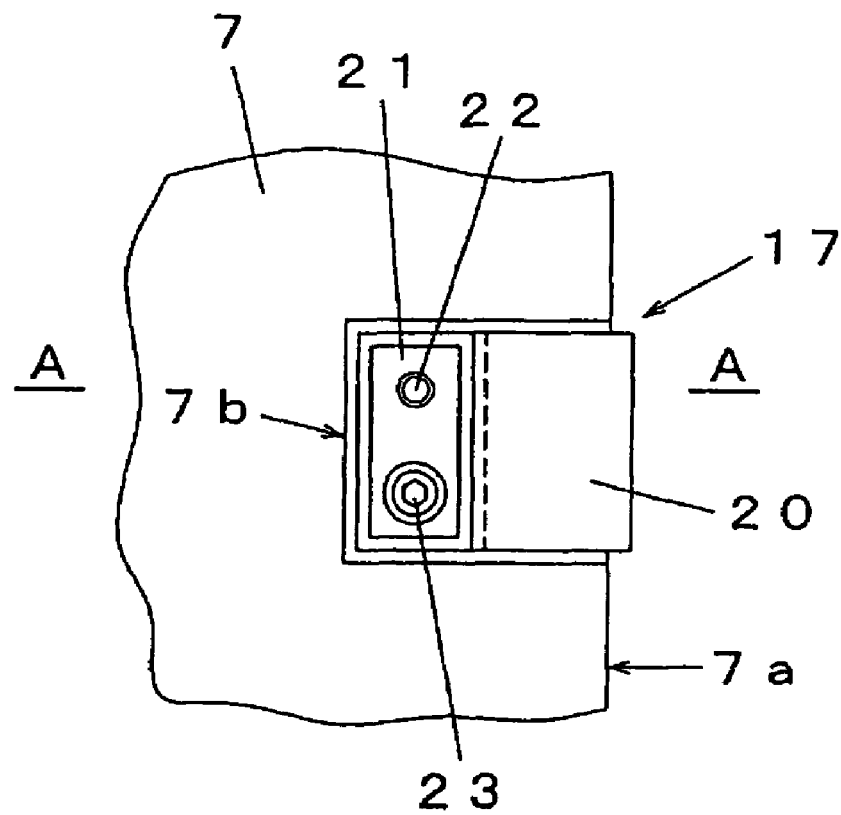
FIGS. 3A, 3B and 4 are views for explaining the mounting of a warp correcting member in the screen printer in one embodiment mode of the present invention.
Figure 3B:
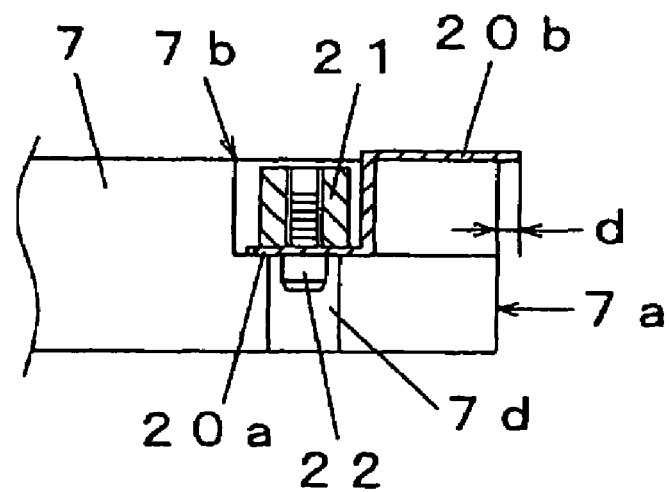
Figure 4:
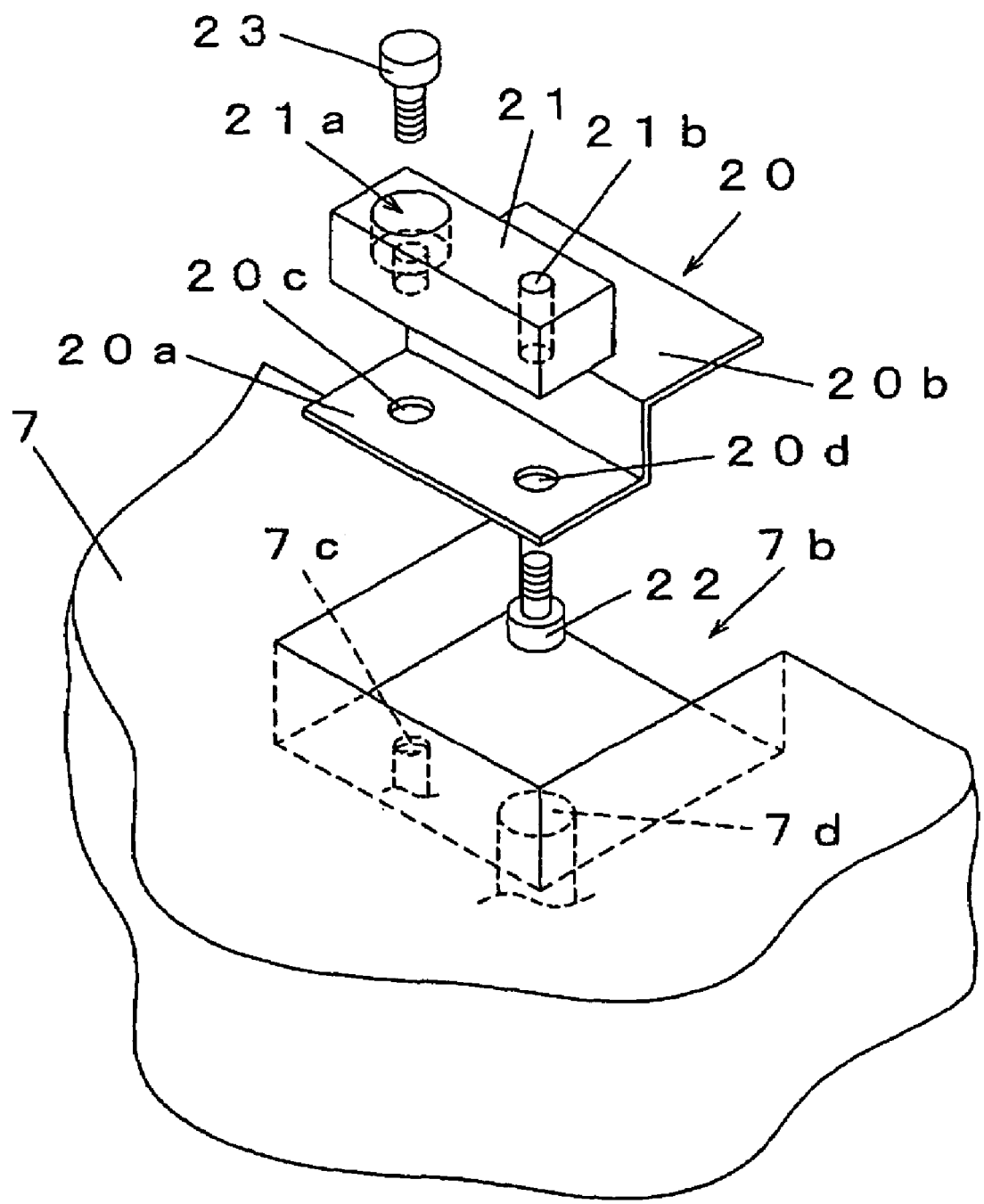

As shown in FIG. 2, plural warp correcting portions 17 are arranged on the clamp face 7a side of the clamper 7. With reference to FIGS. 3A, 3B and 4, the structure of the warp-correcting portion 17 will be explained. FIG. 3B shows an A—A section in FIG. 3A. In the clamper 7, concave portions 7b each formed by cutting the upper end portion of the clamp face 7a side in a square shape are arranged in plural places, and a warp correcting member 20 is mounted into the concave portion 7b by a mounting block 21.

As shown in FIG. 3B, the warp correcting member 20 is manufactured by bending and processing a plate-shaped member of a resilient metal (e.g., spring steel and stainless steel) of about 0.1 mm in thickness such that a section has two horizontal portions of a fixing end portion 20a and a free end portion 20b. The thickness of the warp-correcting member 20 is suitably set in accordance with rigid and warps deforming degrees of the substrate 6 as an object. As shown in FIG. 4, attaching holes 20c, 20d are arranged in the fixing end portion 20a, and an attaching hole 21a having a counter boring portion, and a screw hole 21b are arranged on the upper face side in the mounting block 21.

When the warp correcting member 20 is mounted into the concave portion 7b, the warp correcting member 20 and the mounting block 21 are first fixedly attached by inserting a bolt 22 into the attaching hole 20d from the lower face side of the fixing end portion 20a and screwing and fastening the bolt 22 to the screw hole 21b. Then, in a state in which the fixing end portion 20a is located along the bottom face of the concave portion 7b, a bolt 23 is screwed and fastened to a hole portion 7c formed within the concave portion 7b through the attaching holes 21a, 20c. Thus, the warp-correcting member 20 is mounted in a state in which the fixing end portion 20a is nipped between the mounting block 21 and the bottom face of the concave portion 7b. The bolt 23 is freely detached by fastening and unfastening the bolt 23 with respect to the hole portion 7c of the concave portion.

In this mounting state, as shown in FIG. 3, the shapes and sizes of the warp correcting member 20 and the concave portion 7b are determined so as to set a state in which the lower face of the free end portion 20b is conformed to the height of the upper face of the clamper 7 and the tip portion of the free end portion 20b is projected by a projecting length d required as a pressing length at the warp correcting time described later from the clamp face 7a. Namely, in the warp correcting member 20, the fixing end portion 20a as one end side is fixed into the concave portion 7b arranged on the upper face of the clamper 7, and the free end portion 20b as the other end side is extended from the clamp face 7a to the substrate 6 side at the same height as the height of the upper face of the clamper 7.

In a state in which the warp correcting member 20 is mounted into the concave portion 7b by the bolts 22, 23, the head portion of the bolt 22 is stored into a hole portion 7d arranged within the concave portion 7b, and the head portion of the bolt 23 is stored into a counter boring hole of the attaching hole 21a. In the mounting state of the warp correcting member 20, the very thin warp correcting member 20 is merely projected by only the thickness amount on the upper face of the clamper 7 so as not to obstruct the printing operation at this printing operation time.

Figure 5A:
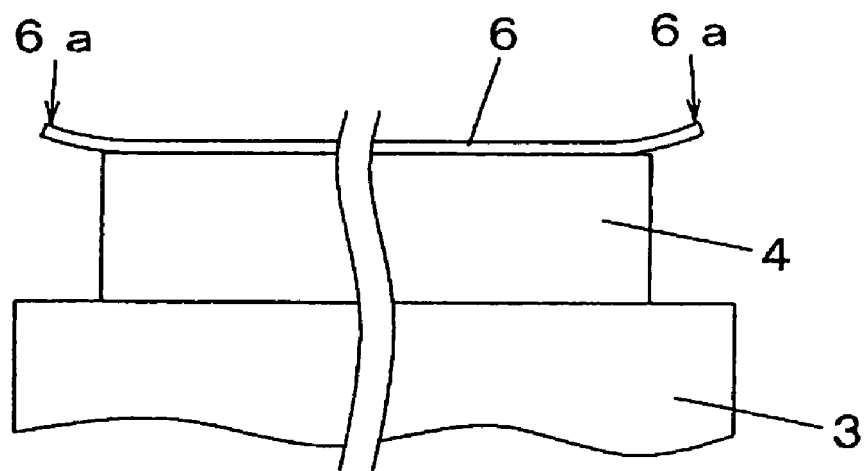
FIGS. 5A, 5B, 6A and 6B are views for explaining the function of a warp correcting portion in the screen printer in one embodiment mode of the present invention.
Figure 5B:
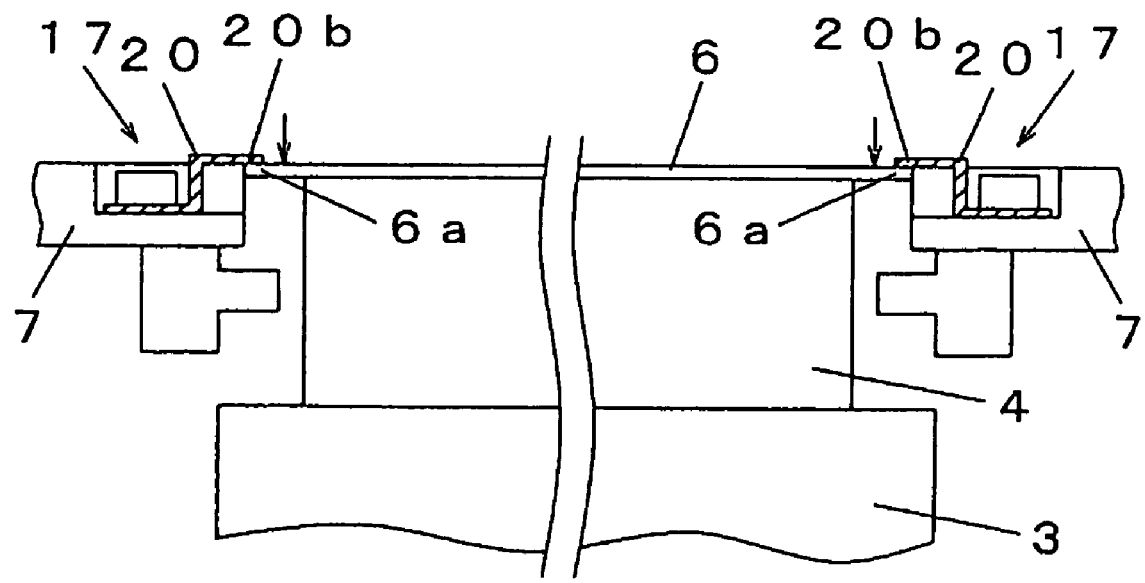

FIGS. 5A and 5B shows the function of a warp correcting portion 17 in a state in which the substrate 6 is clamped by the clamper 7. There are many cases in which a side end portion 6a is generally flexed upward, warped and deformed as shown in FIG. 5A in the substrate 6 carried into the substrate positioning portion 1. Therefore, when the substrate 6 is nipped and clamped from both sides thereof by the clamper 7, faults such as a clamp failure unable to normally nip the end face of the substrate 6, dislocation of the substrate 6 from the clamp state due to impact, etc. in moving the substrate positioning portion 1 after the substrate 6 is once clamped, etc. are easily caused.

In such a case, the tip of the free end portion 20b of the warp correcting member 20 is also abutted on the side end portion 6a of the substrate 6 by arranging the warp correcting portion 17 having the warp correcting member 20 of the above shape in the clamper 7 in the state in which the substrate 6 held to the substrate holding portion on the Z-axis table 4 is clamped as shown in FIG. 5B. Thus, the side end portion 6a is pressed downward by the elastic force of the warp-correcting member 20 and the warp deformation flexed upward is corrected.

Namely, the warp correcting portion 17 arranged in the clamper 7 corrects the warp deformation of the substrate 6 by abutting the free end portion 20b of the warp correcting member 20 on the upper face side of the side end portion 6a of the substrate 6 and pressing the free end portion 20b downward in a state in which the substrate 6 is nipped by the clamper 7. In the state in which the substrate 6 is clamped by the clamper 7, the side end portion 6a is reliably engaged by the tip portion of the free end portion 20b projected by the projecting length d (see FIG. 3) from the clamp face 7a, and no fault of dislocating the substrate 6 from the clamp state is generated.

Figure 6A:
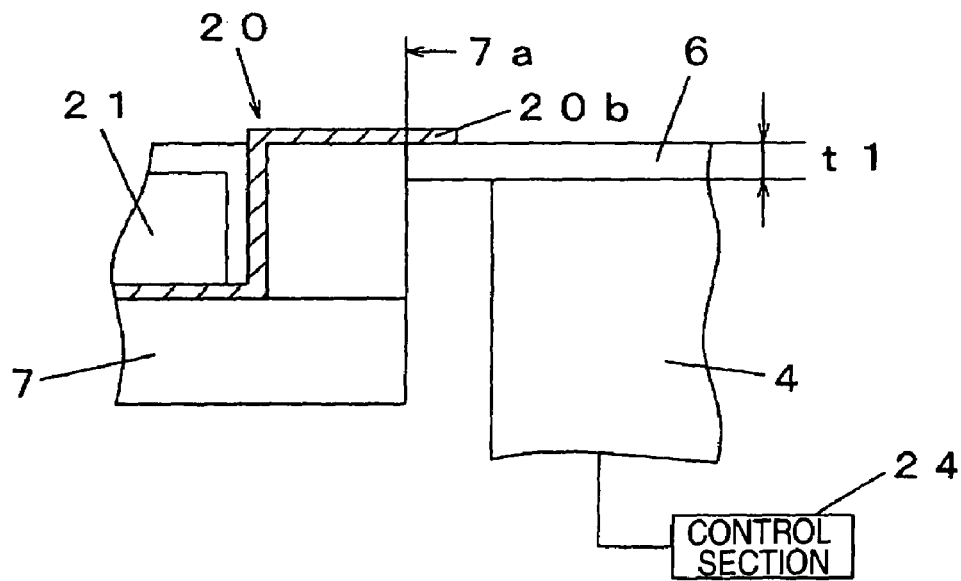

FIG. 6A shows the position of the substrate 6 in its height direction in the clamp state. Since the substrate 6 as a printing object is variously different in thickness, the thickness t1 of the substrate 6 is inputted in advance before the screen printing work is started. When the substrate 6 is clamped in the screen printing operation, the operation of the Z-axis table 4 is controlled by a control section 24 such that the upper face of the substrate 6 is conformed to the height of the upper face of the clamper 7, therefore, the height of the lower face of the free end portion 20b. Namely, the Z-axis table 4 functions as a position aligning raising-lowering means for aligning the height position of the upper face of the held substrate 6 by raising and lowering the substrate holding portion of the upper face with the lower face of the warp correcting member 20.

Figure 6B:
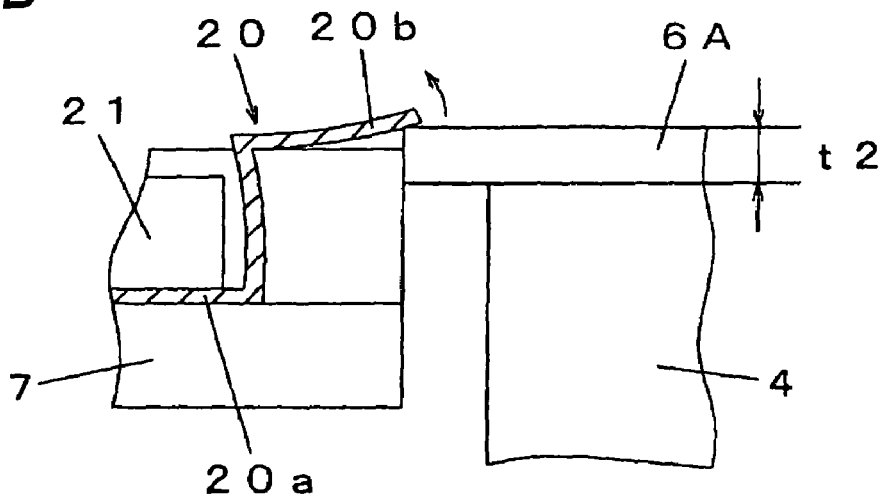

FIG. 6B shows the behavior of the warp correcting member 20 when the substrate 6A of thickness t2 (>t1) is carried-in in error in an inputting state of the thickness t1 as mentioned above. As mentioned above, the warp-correcting member 20 is rich in flexibility since the warp-correcting member 20 is a plate-shaped member constructed by a thin plate of about 1 mm in thickness. When upward force is applied to the tip portion of the free end portion 20b, the warp-correcting member 20 is flexed upward with the fixing end portion 20a side nipped by the mounting block 21 as a fulcrum as shown in FIG. 6B. Thus, deformation of the substrate and damage of the warp-correcting member 20 itself are not caused even when substrate data are inputted in error.

Thus, the substrate 6 can be normally clamped by arranging the warp-correcting portion 17 of the above construction in the clamper 7 without separately arranging a dedicated mechanism for the flexure correction required in the conventional screen printer. Further, in the clamp state, the side end portion 6a of the substrate 6 is always engaged by the warp-correcting member 20. Therefore, even when the substrate of a kind having a strong warp tendency is set to an object, no fault that the substrate is dislocated from the clamp state during the movement of the substrate positioning portion is caused. Accordingly, the warp deformation of the substrate is corrected by a simple and cheap mechanism, and the clamp state can be reliably held.

The screen printer of the present invention has the effect that the warp deformation of the substrate is corrected by a simple and cheap mechanism, and the clamp state can be reliably held. This screen printer is useful in a field for printing paste such as cream solder, electrically conductive paste, etc. to the substrate.

This application is based upon and claims the benefit of priority of Japanese Patent Application No. 2004-12652 filed on Jan. 21, 2004, the contents of which are incorporated herein by reference in its entirety.

What is claimed is:

1. A screen printer in which a mask plate having a pattern hole is abutted on a substrate positioned in a substrate positioning portion, and paste is printed on the substrate through said pattern hole by supplying the paste onto the mask plate and sliding a squeegee, the screen printer comprising:
   a substrate holding portion for holding the substrate in said substrate positioning portion;
   a clamp means for nipping and holding the end face of a side end portion of the substrate held in said substrate holding portion from both sides by a clamp face of a clamp member;
   a warp correcting portion arranged in a concave portion arranged on an upper face of said clamp member and correcting warp deformation of the substrate by abutting a warp correcting member on the upper face side of the side end portion of the substrate in a state in which said substrate is nipped by the clamp member; and
   a position aligning raising-lowering means for aligning the height position of the upper face of the held substrate with the lower face of said warp correcting member by raising and lowering said substrate holding portion.

2. A screen printer in which a mask plate having a pattern hole is abutted on a substrate positioned in a substrate positioning portion, and paste is printed on the substrate through said pattern hole by supplying the paste onto the mask plate and sliding a sgueegee, the screen printer comprising:
   a substrate holding portion for holding the substrate in said substrate positioning portion;
   a clamp means for nipping and holding the end face of a side end portion of the substrate held in said substrate holding portion from both sides by a clamp face of a clamp member;
   a warp correcting portion arranged in said clamp member and correcting warp deformation of the substrate by abutting a warp correcting member on the upper face side of the side end portion of the substrate in a state in which said substrate is nipped by the clamp member; and
   a position aligning raising-lowering means for aligning the height position of the upper face of the held substrate with the lower face of said warp correcting member by raising and lowering said substrate holding portion,
   wherein said warp correcting member is a flexible plate-shaped member fixed into a concave portion arranged on the upper face of said clamp member on one end side and extended from the clamp face to the substrate side at the same height as the upper face height of the clamp member on the other end side.

3. The screen printer according to claim 2, wherein said plate-shaped member is flexed upward with said one end side as a fulcrum when upward force is applied to said other end side.

4. The screen printer according to claim 3, wherein said plate-shaped member has a section having two horizontal portions of a fixing end portion and a free end portion.

5. The screen printer according to claim 4, wherein said warp correcting member is mounted in a state in which the fixing end portion is nipped between a mounting block and the concave portion.

6. A screen printer in which a mask plate having a pattern hole is abutted on a substrate positioned in a substrate positioning portion, and paste is printed on the substrate through said pattern hole by supplying the paste onto the mask plate and sliding a sgueegee, the screen printer comprising:
   a substrate holding portion for holding the substrate in said substrate positioning portion;
   a clamp means for nipping and holding the end face of a side end portion of the substrate held in said substrate holding portion from both sides by a clamp face of a clamp member;
   a warp correcting portion arranged in said clamp member and correcting warp deformation of the substrate by abutting a warp correcting member on the upper face side of the side end portion of the substrate in a state in which said substrate is nipped by the clamp member; and
   a position aligning raising-lowering means for aligning the height position of the upper face of the held substrate with the lower face of said warp correcting member by raising and lowering said substrate holding portion,
   wherein plural warp correcting members are arranged and are mounted to plural concave portions arranged on the upper face of said clamp face.

7. The screen printer according to claim 6, wherein said warp correcting member is freely detached from said concave portion.

* * * * *